US011552550B2

(12) United States Patent
Nosaka et al.

(10) Patent No.: US 11,552,550 B2
(45) Date of Patent: Jan. 10, 2023

(54) VOLTAGE BALANCE CIRCUIT FOR SEMICONDUCTOR DEVICES CONNECTED IN SERIES WITH EACH OTHER, SWITCHING CIRCUIT, AND POWER CONVERTER APPARATUS

(71) Applicant: OMRON Corporation, Kyoto (JP)

(72) Inventors: Noriyuki Nosaka, Nara (JP); Wataru Okada, Kizugawa (JP); Chen Chen, Kizugawa (JP); Takanori Ishii, Uji (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 17/274,991

(22) PCT Filed: Mar. 14, 2019

(86) PCT No.: PCT/JP2019/010550
§ 371 (c)(1),
(2) Date: Mar. 10, 2021

(87) PCT Pub. No.: WO2020/183702
PCT Pub. Date: Sep. 17, 2020

(65) Prior Publication Data
US 2022/0060101 A1    Feb. 24, 2022

(51) Int. Cl.
*H02M 1/088* (2006.01)
*H02M 7/537* (2006.01)

(52) U.S. Cl.
CPC .......... *H02M 1/088* (2013.01); *H02M 7/537* (2013.01)

(58) Field of Classification Search
CPC .......... H02M 1/00; H02M 1/088; H02M 7/00; H02M 7/537; H03K 3/00; H03K 3/0231;
(Continued)

(56) References Cited

U.S. PATENT DOCUMENTS

| 4,670,667 A | * | 6/1987 | Petit | .................. | H03K 17/10 |
| | | | | | 327/482 |
| 5,972,231 A | | 10/1999 | Dibene, II | | |
| 2021/0257948 A1 | * | 8/2021 | Toyodome | .............. | H02P 27/08 |

FOREIGN PATENT DOCUMENTS

| JP | 2002204578 A | 7/2002 |
| JP | 2005167535 A | 6/2005 |

(Continued)

OTHER PUBLICATIONS

EPO Extended European Search Report for corresponding EP Application No. 19919265.9; dated Feb. 7, 2022.
(Continued)

*Primary Examiner* — Diana J. Cheng
*Assistant Examiner* — Dave Mattison
(74) *Attorney, Agent, or Firm* — Cantor Colburn LLP

(57) ABSTRACT

A voltage balance circuit including first and second semiconductor devices connected in series with each other is provided with a first transformer having a primary winding and a secondary winding, a second transformer having a primary winding and a secondary winding. A pair of capacitors connected in series with each other and connected between the output terminals of the plurality of semiconductor devices. A first control signal is applied to the control electrode of the first semiconductor device via the primary winding of the first transformer. A second control signal is applied to the control electrode of the second semiconductor device via the primary winding of the second transformer, with one end of each secondary winding connected to each other.

5 Claims, 7 Drawing Sheets

(58) Field of Classification Search
CPC ........ H03K 17/00; H03K 17/10; H03K 17/56;
H03K 3/14; H03K 5/00; H03K 4/00;
H03K 4/06; H03K 4/12; H03K 4/20;
H03K 4/50
USPC ......................................................... 363/131
See application file for complete search history.

(56) References Cited

FOREIGN PATENT DOCUMENTS

| | | |
|---|---|---|
| JP | 2010193563 A | 9/2010 |
| JP | 4760256 B2 | 8/2011 |

OTHER PUBLICATIONS

International Search Report for International Application No. PCT/JP2019/010550; dated May 21, 2019.
PCT Written Opinion of the International Searching Authority for International Application No. PCT/JP2019/010550 dated May 21, 2019.

\* cited by examiner

VOLTAGE BALANCE CIRCUIT FOR SEMICONDUCTOR DEVICES CONNECTED IN SERIES WITH EACH OTHER, SWITCHING CIRCUIT, AND POWER CONVERTER APPARATUS

The present invention relates to, for example, a voltage balance circuit for a plurality of semiconductor devices connected in series with each other, a switching circuit using the same voltage balance circuit, and a power converter apparatus.

BACKGROUND ART

By connecting, for example, a plurality of semiconductor devices that are switch elements in series with each other, and switching on and off the semiconductor devices in synchronization as one element, a switching circuit that obtains a high-withstand voltage property is achievable by using low-withstand voltage devices. In this case, low-withstand voltage semiconductor devices are remarkably cheaper in price and smaller in on-resistance than high-withstand voltage semiconductor devices. This can lead to lower cost and higher operation efficiency. However, once the voltage balance is lost due to variations in electrical characteristics of the semiconductor devices, the voltage design standard may be exceeded. In particular, such a situation may occur when there are variations in output capacities of the semiconductor devices.

In order to address such an issue, for example, in Patent Document 1, in a known example circuit in which a plurality of semiconductor devices are connected in series with each other, the gate currents (Ig1, Ig2) of the respective semiconductor devices are balanced by using one transformer in each drive circuit, so as to balance the drain-source voltages (Vds) among the respective semiconductor devices when switching. In this case, a switching control signal from a first drive circuit is used for driving a first semiconductor device through primary winding of the above-described transformer. On the other hand, a switching control signal from a second drive circuit is used for driving a second semiconductor device through secondary winding of the above-described transformer. It is to be noted that the first and second drive circuits and the gates of the semiconductor devices are connected with each other, so that the induced voltage across the primary winding of the above-described transformer due to the switching control signal and the induced voltage across the secondary winding due to the switching control signal are directed in opposite directions to each other.

PRIOR ART DOCUMENT

Patent Document

Patent Document 1: Japanese patent No. JP4760256B2.

SUMMARY OF THE INVENTION

Problems to be Solved by the Invention

The inventors of the present invention performed simulations on the above-described known circuit, and found out that, when the output capacity of each semiconductor device varied by 20%, the gate currents of the respective semiconductor devices matched each other, but the drain-source voltages Vds diverged from each other.

In the above-described known circuit, a large-sized transformer is used. This causes an increase in the circuit scale and such a problem that a voltage imbalance occurs due to variations in the semiconductor devices (for example, an output capacitance, a threshold value, and the like). As a result, a voltage exceeding the withstand voltages of elements is applied to the semiconductor devices, the semiconductor devices are destroyed, or a large bias occurs in the generation loss when switching. Accordingly, the heat generation and the lives of the semiconductor devices may be largely affected.

An object of the present invention is to provide a voltage balance circuit that addresses the issues described above, and that in a circuit in which a plurality of semiconductor devices are connected in series with each other, can keep voltage balance among output voltages when switching between the plurality of semiconductor devices with higher accuracy than that in the prior art, a switching circuit using the same, and a power converter apparatus.

Means for Solving the Problems

According to one aspect of the present invention, there is provided a voltage balance circuit that keeps balance among respective output voltages from a plurality of semiconductor devices connected in series with each other. The plurality of semiconductor devices including at least first and second semiconductor devices, and each of the first and second semiconductor devices includes a control electrode and first and second device electrodes. The voltage balance circuit includes a first transformer including a primary winding and a secondary winding; a second transformer including a primary winding and a secondary winding; and first and second capacitors connected in series with each other.

One end of the first capacitor is connected with the first device electrode of the first semiconductor device, one end of the second capacitor is connected with the second device electrode of the second semiconductor device, and another ends of the first and second capacitors are connected with each other, and are connected with another end of the secondary winding of the first transformer.

A first output terminal of a first control signal for controlling the first semiconductor device is connected with one end of the primary winding of the first transformer, and another end of the primary winding of the first transformer is connected with the control electrode of the first semiconductor device. A second output terminal of the first control signal is connected with the second device electrode of the first semiconductor device, the first device electrode of the second semiconductor device, and another end of the primary winding of the second transformer.

A first output terminal of a second control signal for controlling the second semiconductor device is connected with the one end of the primary winding of the second transformer, and another end of the primary winding of the second transformer is connected with the control electrode of the second semiconductor device. A second output terminal of the second control signal is connected with the second device electrode of the second semiconductor device.

The first control signal is applied to the control electrode of the first semiconductor device through the primary winding of the first transformer, and the second control signal is applied to the control electrode of the second semiconductor device through the primary winding of the second transformer. One ends of the secondary windings are connected with each other.

Effects of the Invention

Therefore, according to the present invention, in the circuit in which a plurality of semiconductor devices are connected in series with each other, the voltage balance among the output voltages when switching between the plurality of semiconductor devices can be kept with higher accuracy than that in the prior art.

MODES FOR CARRYING OUT THE INVENTION

Figure 1:
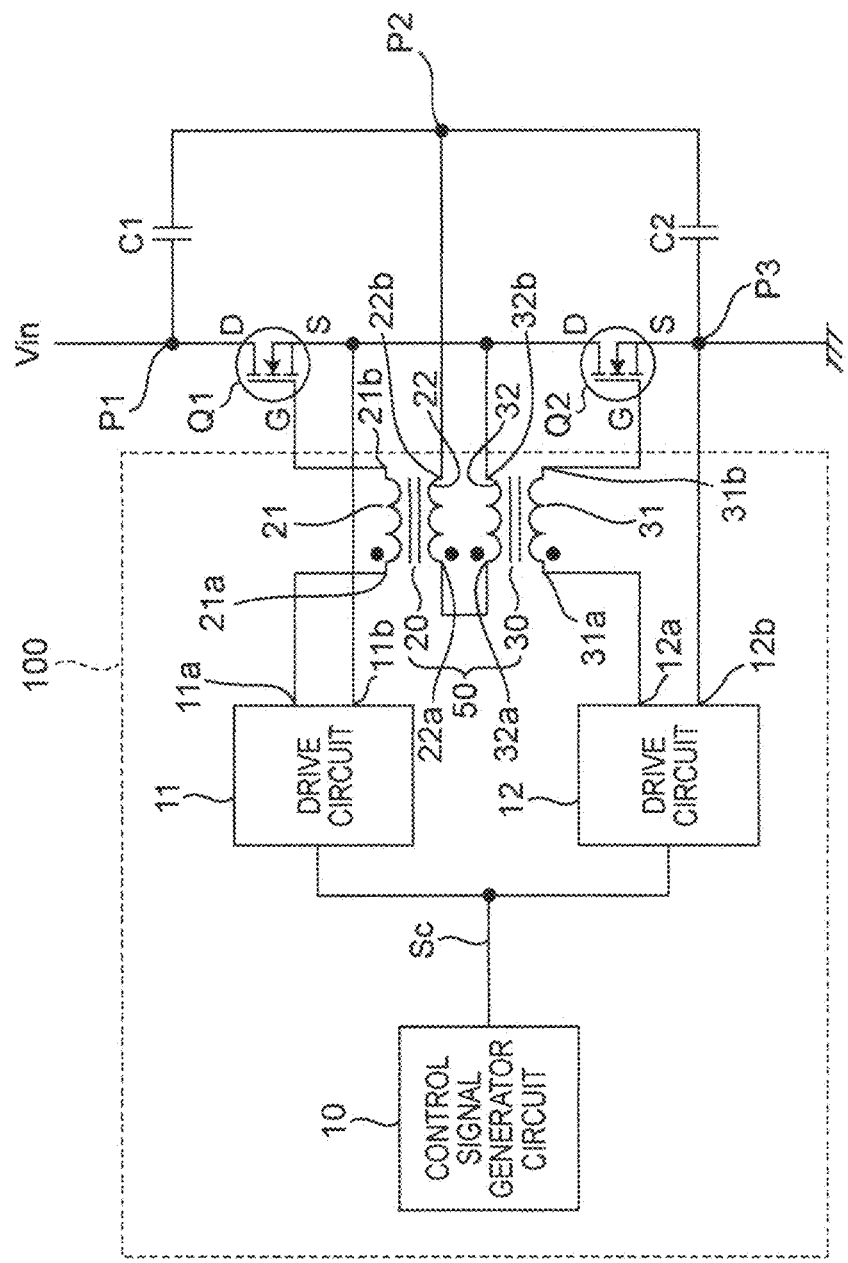
FIG. 1 is a circuit diagram showing a configuration example of a switching circuit 100 according to a first embodiment and its peripheral circuits.

Hereinafter, embodiments according to the present invention will be described with reference to the drawings. It is to be noted that the same or similar components are designated by the same reference numerals.

First Embodiment

FIG. 1 is a circuit diagram showing a configuration example of a switching circuit 100 according to a first embodiment and its peripheral circuits. Referring to FIG. 1, the switching circuit 100 includes a control signal generator circuit 10, a pair of drive circuits 11 and 12, and a pair of transformers 20 and 30. In this case, the pair of transformers 20 and 30 configures a voltage balance circuit 50 for keeping voltage balance between drain (first device electrodes)-source (second device electrodes) voltages (output voltages) of the pair of semiconductor devices Q1 and Q2, when switching control signals are respectively applied to gates (control electrodes) of the pair of semiconductor devices Q1 and Q2.

Referring to FIG. 1, the semiconductor devices Q1 and Q2 are, for example, N-channel MOS field effect transistors, which are connected in series with each other. That is, an input voltage Vin is applied to the drain of the semiconductor device Q1, the source of the semiconductor device Q1 is connected with the drain of the semiconductor device Q2, and the source of the semiconductor device Q2 is grounded.

The transformer 20 includes primary winding 21 and secondary winding 22, and the transformer 30 includes primary winding 31 and secondary winding 32. A winding start terminal 21a of the primary winding 21 of the transformer 20 is connected with a signal output terminal 11a of the drive circuit 11, and a winding end terminal 21b of the primary winding 21 is connected with the gate of the semiconductor device Q1. In addition, a winding start terminal 31a of the primary winding 31 of the transformer 30 is connected with a signal output terminal 12a of the drive circuit 12, and a winding end terminal 31b of the primary winding 31 is connected with the gate of the semiconductor device Q2.

A signal reference terminal 11b of the drive circuit 11 is connected with the source of the semiconductor device Q1, and a signal reference terminal 12b of the drive circuit 12 is grounded. A winding end terminal 32b of the secondary winding 32 is connected with the source of the semiconductor device Q1 and the drain of the semiconductor device Q2. The drain of the semiconductor device Q1 is connected with a winding end terminal 22b of the secondary winding 22 through a connection point P1, a capacitor C1, and a connection point P2. The source of the semiconductor device Q2 is connected with the winding end terminal 22b of the secondary winding 22 through a connection point P3, a capacitor C2, and the connection point P2. The capacitances of the capacitors C1 and C2 are equal to each other.

Referring to FIG. 1, the control signal generator circuit 10 generates, for example, a switching control signal Sc, which is a rectangular wave, and outputs the switching control signal Sc to each of the drive circuits 11 and 12. The drive circuit 11 amplifies the input switching control signal, and then supplies an amplified switching control signal to the gate of the semiconductor device Q1 through the primary winding 21 of the transformer 20, so as to drive on and off of the semiconductor device Q1. The drive circuit 12 amplifies the input switching control signal, and then supplies an amplified switching control signal to the gate of the semiconductor device Q2 through the primary winding 31 of the transformer 30, so as to drive on and off of semiconductor device Q2.

The switching circuit 100 of FIG. 1 configured as described above switches the input voltage Vin by driving on and off of the semiconductor devices Q1 and Q2 according to the switching control signal Sc. In this case, in the voltage balance circuit 50, directions of induced voltages across the secondary windings 22 and 32 are made opposite to each other by the switching control signals Sc respectively applied to the primary windings 21 and 31 of the transformers 20 and 30. In addition, the pair of capacitors C1 and C2 is connected to be symmetrical with respect to the connection point P2 used as a reference on output sides of the semiconductor devices Q1 and Q2, which are connected in series with each other. That is, the connection point P2 of the capacitors C1 and C2 is connected with the connection point of the semiconductor devices Q1 and Q2 through the secondary windings 22 and 32 of the transformers 20 and 30. The average voltage value (Vds1+Vds2)/2 of the drain-source voltages is sensed by using the capacitors C1 and C2. When the drain-source voltages Vds1 and Vds2 of the semiconductor devices Q1 and Q2 are not equal to each other and the voltage balance is lost, predetermined current flows across the secondary windings 22 and 32 of the transformers 20 and 30, and the transformers 20 and 30 electromagnetically couple the primary winding circuit on the gate side. Accordingly, predetermined current flows across the semiconductor devices Q1 and Q2 in directions in which the voltage balance among the drain-source voltages Vds1 and Vds2 is kept between the respective semiconductor devices Q1 and Q2.

As described above, the voltage balance among the drain-source voltages Vds1 and Vds2 when switching between the respective semiconductor devices Q1 and Q2 can be kept with higher accuracy than that in the prior art. This enables significant suppression of failure of the semiconductor devices Q1 and Q2. In addition, the inventors carried out simulations and found out that the voltage balance was kept, when the device capacities of the semiconductor devices Q1 and Q2 varied by 20%.

Second Embodiment

Figure 2:
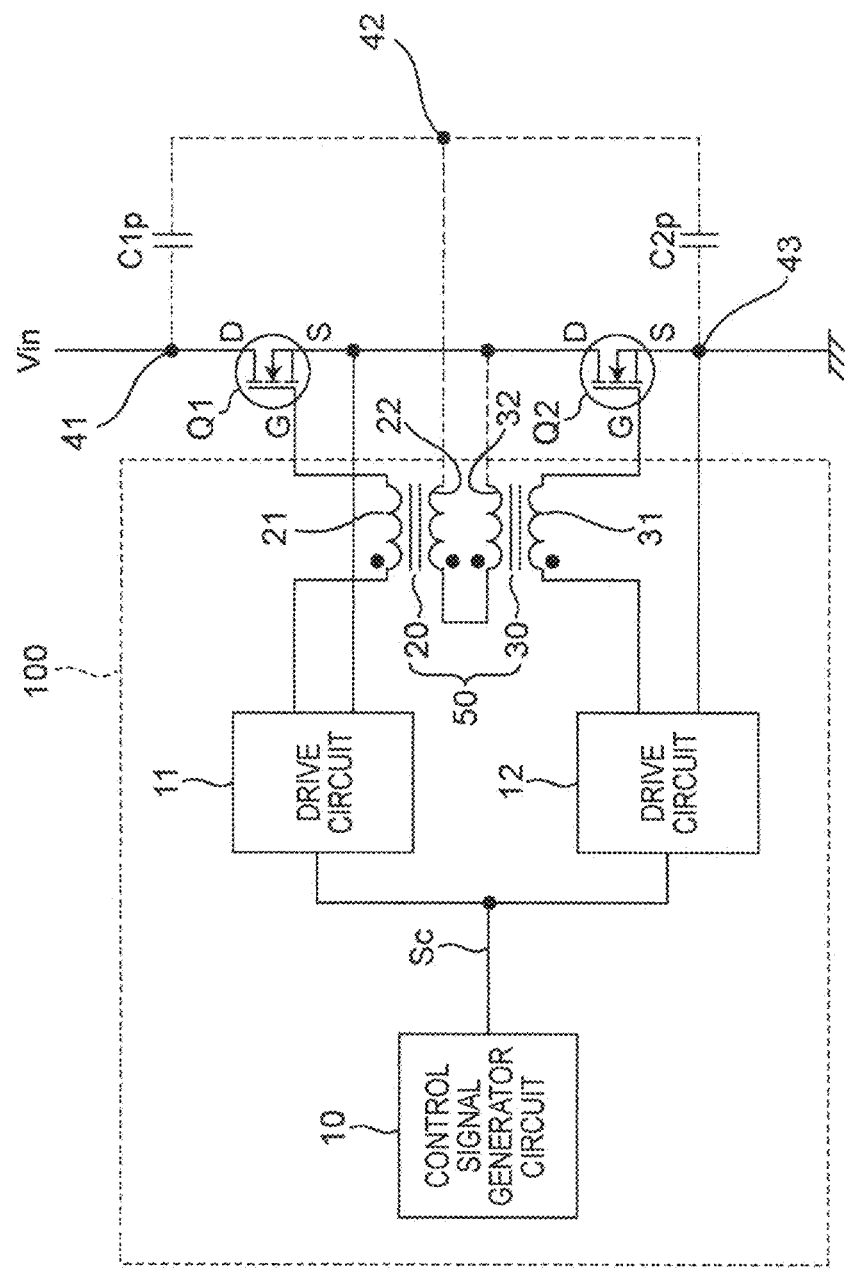
FIG. 2 is a circuit diagram showing a configuration example of a switching circuit 100 according to a second embodiment and its peripheral circuits.
Figure 3A:
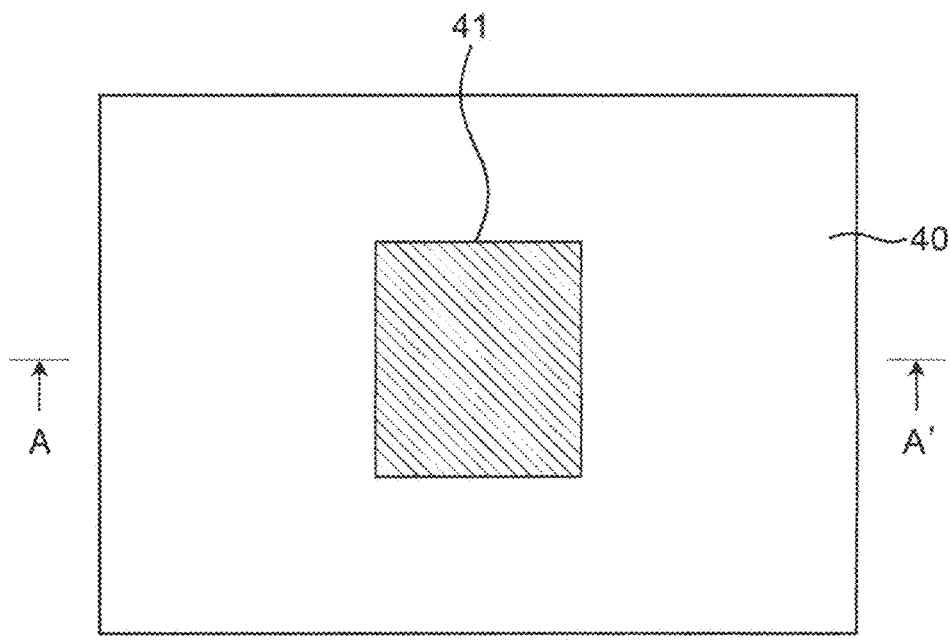
FIG. 3A is a plan view of an electrode 41 part of FIG. 2.
Figure 3B:
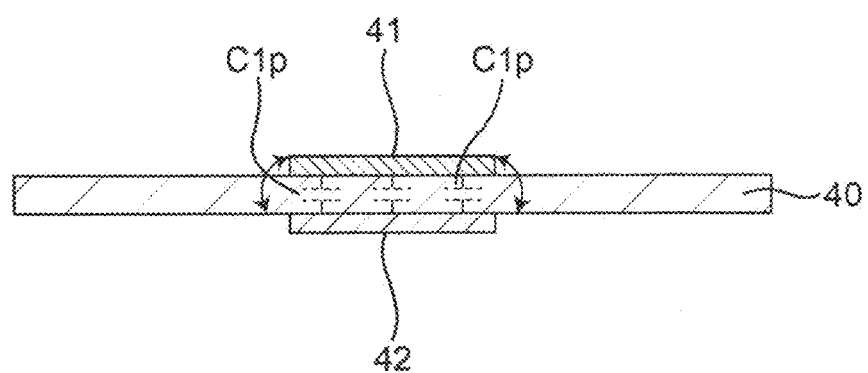
FIG. 3B is a vertical cross-sectional view taken along the line A-A' of FIG. 3A.

FIG. 2 is a circuit diagram showing a configuration example of a switching circuit 100 according to a second embodiment and its peripheral circuits. In addition, FIG. 3A is a plan view of an electrode 41 part of FIG. 2, and FIG. 3B is a vertical cross-sectional view of the line A-A' of FIG. 3A. In the peripheral circuits of the switching circuit 100 of FIG. 2, the capacitors C1 and C2 are replaced with parasitic capacitances C1p and C2p, respectively, as compared to the peripheral circuits of FIG. 1.

Specifically, as shown in FIGS. 3A and 3B, the parasitic capacitance C1p is formed to be parasitic between a pair of electrodes 41 and 42 sandwiching a dielectric substrate 40 on which semiconductor devices Q1 and Q2 are mounted, and facing each other. The parasitic capacitance C2p is formed to be parasitic between a pair of electrodes 42 and 43 sandwiching the dielectric substrate 40, in the same manner as the parasitic capacitance C1p.

Also in the voltage balance circuit 50 configured as described above, directions of the induced voltages across the secondary windings 22 and 32 are made opposite to each other by the switching control signals Sc respectively applied to the primary windings 21 and 31 of the transformers 20 and 30. In addition, the pair of parasitic capacitance C1p and C2p are connected to be symmetrical with respect to the electrode 42 used as a reference on the output sides of the semiconductor devices Q1 and Q2, which are connected in series with each other. Therefore, the gate currents (Ig1, Ig2) of the respective semiconductor devices Q1 and Q2 can be balanced, and the voltage balance between the drain-source voltages (the output voltages) when switching between the respective semiconductor devices Q1 and Q2 can be kept with higher accuracy than that in the prior art.

Modified Embodiment

Figure 4:
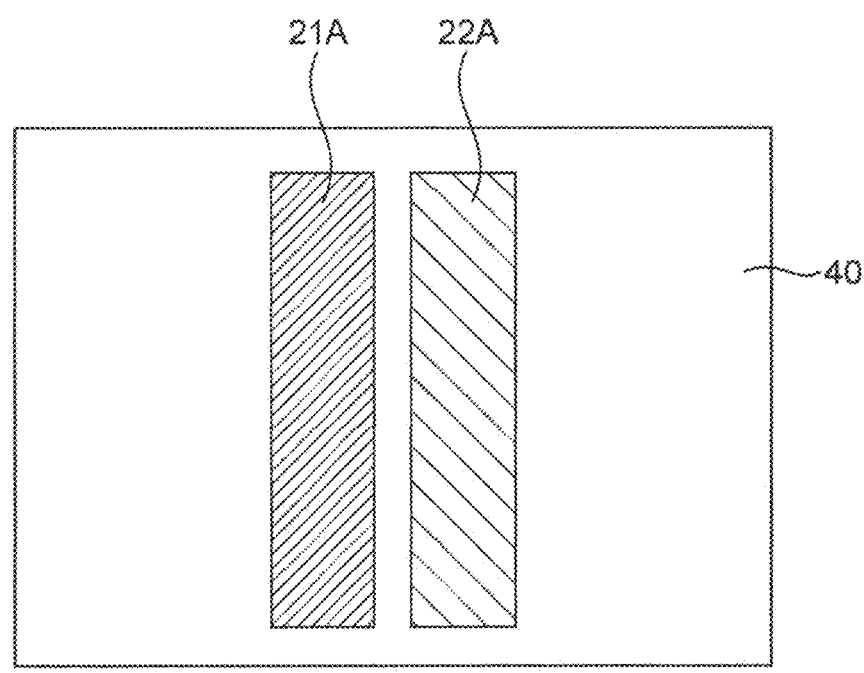
FIG. 4 is a plan view showing a configuration example of primary winding 21A and secondary winding 22A each having an electrode form according to a modified embodiment.

FIG. 4 is a plan view showing a configuration example of the primary winding 21A and the secondary winding 22A each having an electrode form according to a modified embodiment of the first embodiment or the second embodiment. Referring to FIG. 4, which shows a modified embodiment, the primary winding 21 and the secondary winding 22 of the transformer 20 may be respectively the primary winding 21A and the secondary winding 22A of, for example, strip-shaped electrodes facing each other to be electromagnetically coupled with each other on the dielectric substrate 40. The primary winding 31 and the secondary winding 32 of the transformer 30 also may be respectively the first winding and the second winding, each having, for example, a strip-shaped electrode form to be electromagnetically coupled with each other on the dielectric substrate 40. In addition, the primary winding 21A having an electrode form may be provided on the front surface of the dielectric substrate 40, and the secondary winding 22A having an electrode form may be provided on the back surface of the dielectric substrate 40. With such a configuration, the primary winding 21A and the secondary winding 22A may be electromagnetically coupled with each other to achieve functions of the transformers with parasitic components. The voltage balance circuit 50 configured as described above also has the same effects as those in the first and second embodiments.

Third Embodiment

Figure 5:
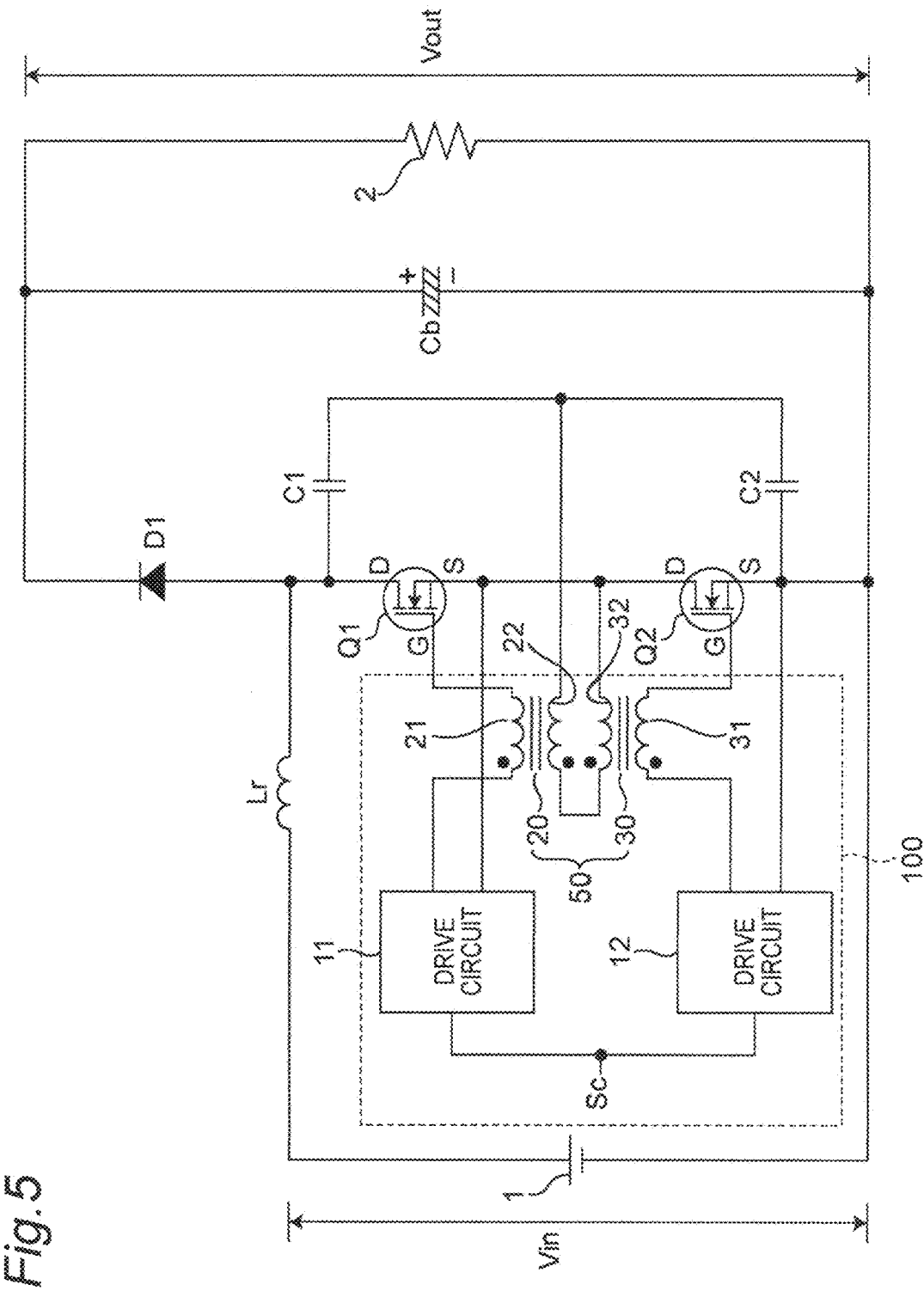
FIG. 5 is a circuit diagram showing a configuration example of a power converter apparatus according to a third embodiment.

FIG. 5 is a circuit diagram showing a configuration example of a power converter apparatus according to a third embodiment. The power converter apparatus of FIG. 5 is an asynchronous rectifying boost chopper circuit using the switching circuit 100 including the voltage balance circuit 50 of FIG. 1.

Referring to FIG. 5, an input voltage Vin from a DC voltage source 1 is applied to the series circuit of the semiconductor devices Q1 and Q2 through a reactor Lr. The drain of the semiconductor device Q1 is connected with a smoothing electrolytic capacitor Cb and a load resistance 2 through a rectifier diode D1.

In the power converter apparatus configured as described above, the input voltage Vin can be boosted by asynchronous rectification, and can be outputted to the load resistance 2. It is to be noted that the operation and advantageous effects of the voltage balance circuit 50 are the same as those in the first and second embodiments.

Fourth Embodiment

Figure 6:
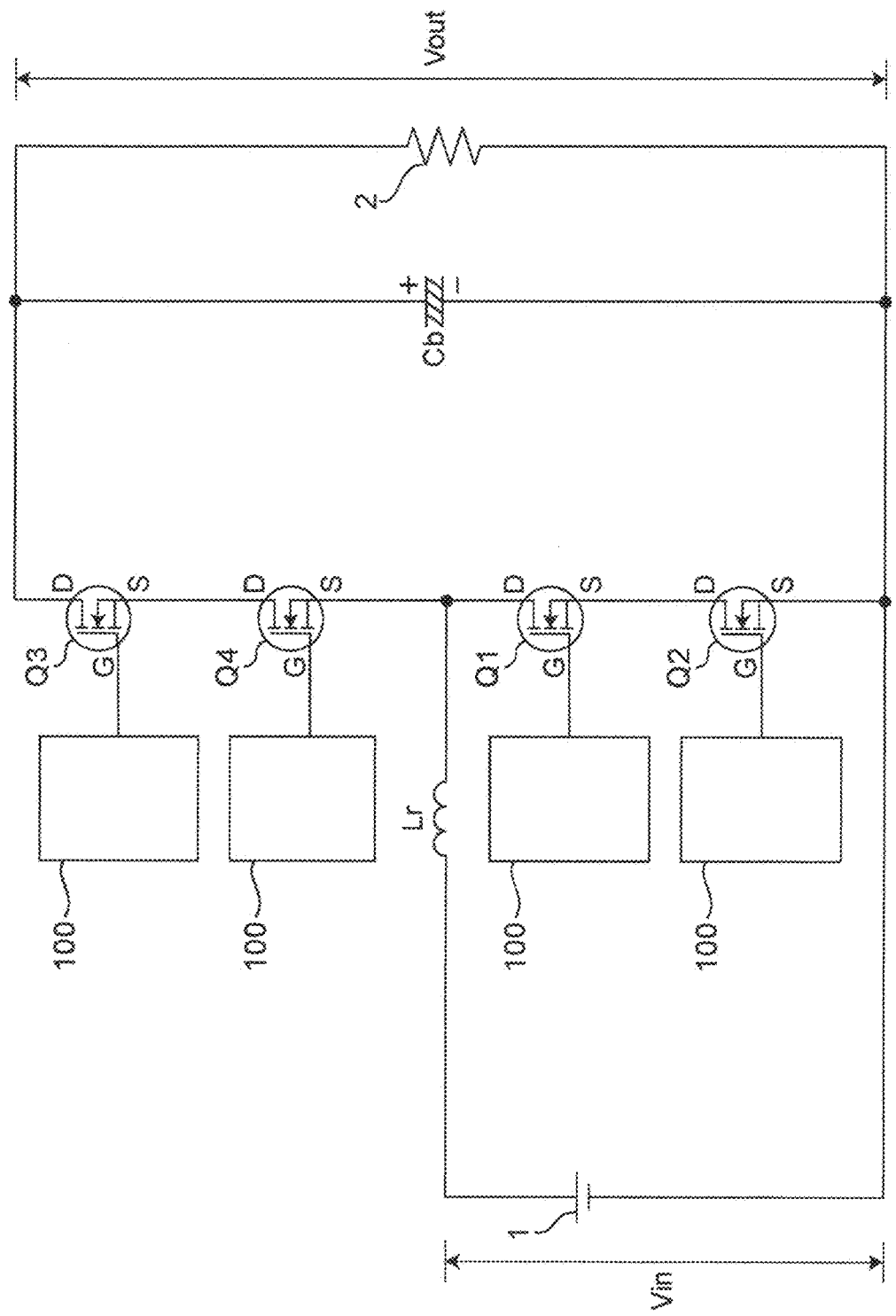
FIG. 6 is a circuit diagram showing a configuration example of a power converter apparatus according to a fourth embodiment.

FIG. 6 is a circuit diagram showing a configuration example of the power converter apparatus according to a fourth embodiment. The power converter apparatus of FIG. 6 is a synchronous boost chopper circuit using the switching circuit 100 including the voltage balance circuit 50 of FIG. 1.

Referring to FIG. 6, the input voltage Vin from the DC voltage source 1 is applied to the series circuit of the semiconductor devices Q1 and Q2 through the reactor Lr. The drain of the semiconductor device Q1 is connected with the smoothing electrolytic capacitor Cb and the load resistance 2 through the semiconductor devices Q4 and Q3. In this case, the semiconductor devices Q3, Q4, Q1, and Q2 are connected in series with each other, and are driven by the switching circuit 100. Turning on and off of the semiconductor devices Q1 and Q2 and turning on and off of the semiconductor devices Q3 and Q4 are inverted from each other.

In the power converter apparatus configured as described above, the input voltage Vin can be boosted synchronously, and can be outputted to the load resistance 2. It is to be noted that the operation and advantageous effects of the voltage balance circuit 50 are the same as those in the first and second embodiments.

Fifth Embodiment

Figure 7:
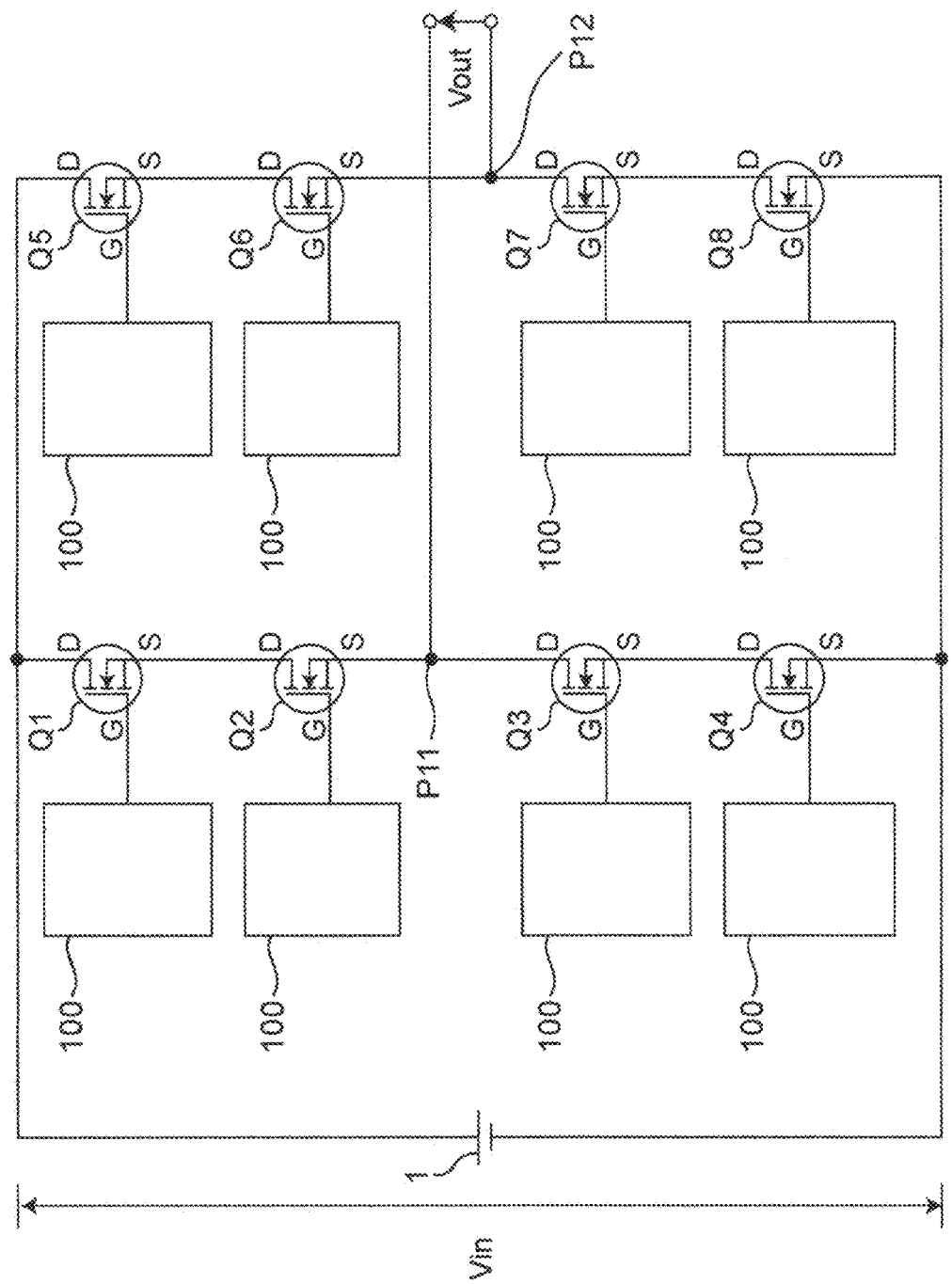
FIG. 7 is a circuit diagram showing a configuration example of a power converter apparatus according to a fifth embodiment.

FIG. 7 is a circuit diagram showing a configuration example of a power converter apparatus according to a fifth embodiment. The power converter apparatus of FIG. 7 is a bridge inverter circuit using the switching circuit 100 including the voltage balance circuit 50 of FIG. 1.

Referring to FIG. 7, the semiconductor devices Q1 to Q4 are connected in series with each other, and the semiconductor devices Q5 to Q8 are connected in series with each other. The series circuit of the semiconductor devices Q1 to Q4 and the series circuit of the semiconductor devices Q5 to Q8 are connected in parallel to each other. The input voltage Vin from the DC voltage source 1 is applied to each of these series circuits, and an output voltage Vout is outputted from the connection point P11 between the source of the semiconductor device Q2 and the drain of the semiconductor device Q3, and from the connection point P12 between the source of the semiconductor device Q3 and the drain of the semiconductor device Q4. In this case, the semiconductor devices Q3, Q4, Q1, and Q2 are connected in series with each other, and are driven by the switching circuit 100. It is to be noted that, turning on and off of the semiconductor devices Q1, Q2, Q7, and Q8 and turning on and off of the semiconductor devices Q3, Q4, Q5, and Q6 are inverted from each other.

In the power converter apparatus configured as described above, the input voltage Vin can be synchronously switched to generate a predetermined AC signal, and can be outputted. It is to be noted that the operation and advantageous effects of the voltage balance circuit 50 are the same as those in the first and second embodiments.

In the above embodiments, the asynchronous rectifying boost chopper circuit, the synchronous boost chopper circuit, the inverter circuit, and the like are described as an example. However, the voltage balance circuit 50 according to the present embodiment may be applied to another power converter apparatus such as a DC/DC converter and an inverter topology circuit, in addition to the above circuits.

INDUSTRIAL APPLICABILITY

As mentioned above in detail, according to the present invention, in the circuit in which a plurality of semiconductor devices are connected in series with each other, the voltage balance among the output voltages when switching between the plurality of semiconductor devices can be kept with higher accuracy than that in the prior art.

REFERENCE SIGNS LIST

1 DC voltage source
2 Load resistance
10 Control signal generator circuit
11, 12 Drive circuit
11a, 12a Signal output terminal
11b, 12b Signal reference terminal
20, 30 Transformer
21, 21A, 31 Primary winding
22, 22A, 32 Secondary winding
21a, 22a, 31a, 32a Winding start terminal
21b, 22b, 31b, 32b Winding end terminal
40 Dielectric substrate
41, 42, 43 Electrode
50 Voltage balance circuit
100 Switching circuit
C1, C2 Capacitor
Cb Electrolytic capacitor
C1p, C2p parasitic capacitance
D1 rectifier diode
Lr reactor
P1 to P3 connection point
Q1 to Q8 MOS transistor

The invention claimed is:

1. A voltage balance circuit that keeps balance among respective output voltages from a plurality of semiconductor devices connected in series with each other, the plurality of semiconductor devices including at least first and second semiconductor devices, each of the first and second semiconductor devices including a control electrode and first and second device electrodes,
wherein the voltage balance circuit comprises:
a first transformer consisting of a primary winding and a secondary winding;
a second transformer consisting of a primary winding and a secondary winding; and
first and second capacitors connected in series with each other,
wherein one end of the first capacitor is connected with the first device electrode of the first semiconductor device,
wherein one end of the second capacitor is connected with the second device electrode of the second semiconductor device,
wherein another ends of the first and second capacitors are connected with each other, and are connected with another end of the secondary winding of the first transformer,
wherein a first output terminal of a first control signal for controlling the first semiconductor device is connected with one end of the primary winding of the first transformer, and another end of the primary winding of the first transformer is connected with the control electrode of the first semiconductor device,
wherein a second output terminal of the first control signal is connected with the second device electrode of the first semiconductor device, the first device electrode of the second semiconductor device, and another end of the secondary winding of the second transformer,
wherein a first output terminal of a second control signal for controlling the second semiconductor device is connected with the one end of the primary winding of the second transformer, and another end of the primary winding of the second transformer is connected with the control electrode of the second semiconductor device,
wherein a second output terminal of the second control signal is connected with the second device electrode of the second semiconductor device,
wherein the first control signal is applied to the control electrode of the first semiconductor device through the primary winding of the first transformer,
wherein the second control signal is applied to the control electrode of the second semiconductor device through the primary winding of the second transformer, and
wherein one ends of the secondary windings are connected with each other.

2. The voltage balance circuit according to claim 1, wherein the first and second capacitors are parasitic capacitance with electrodes facing each other.

3. The voltage balance circuit according to claim 1, wherein the primary windings and the secondary windings of the first and second transformers serve as a pair of electrodes facing each other to be electromagnetically coupled with each other.

4. A switching circuit comprising a voltage balance circuit, the switching circuit switching an input voltage, and outputting a switched input voltage, the switching circuit comprising first and second semiconductor devices that respectively serve as switching elements, wherein the first and second control signals respectively serving as first and second switching control signals, wherein the voltage balance circuit keeps balance among respective output voltages from a plurality of semiconductor devices connected in series with each other, the plurality of semiconductor devices including at least first and second semiconductor devices, each of the first and second semiconductor devices including a control electrode and first and second device electrodes, wherein the voltage balance circuit comprises:

a first transformer consisting of a primary winding and a secondary winding;

a second transformer consisting of a primary winding and a secondary winding; and first and second capacitors connected in series with each other, wherein one end of the first capacitor is connected with the first device electrode of the first semiconductor device, wherein one end of the second capacitor is connected with the second device electrode of the second semiconductor device, wherein another ends of the first and second capacitors are connected with each other, and are connected with another end of the secondary winding of the first transformer, wherein a first output terminal of a first control signal for controlling the first semiconductor device is connected with one end of the primary winding of the first transformer, and another end of the primary winding of the first transformer is connected with the control electrode of the first semiconductor device, wherein a second output terminal of the first control signal is connected with the second device electrode of the first semiconductor device, the first device electrode of the second semiconductor device, and another end of the second winding of the second transformer, wherein a first output terminal of a second control signal for controlling the second semiconductor device is connected with the one end of the primary winding of the second transformer, and another end of the primary winding of the second transformer is connected with the control electrode of the second semiconductor device, wherein a second output terminal of the second control signal is connected with the second device electrode of the second semiconductor device, wherein the first control signal is applied to the control electrode of the first semiconductor device through the primary winding of the first transformer, wherein the second control signal is applied to the control electrode of the second semiconductor device through the primary winding of the second transformer, and wherein one ends of the secondary windings are connected with each other.

5. A power converter apparatus that converts an input voltage into a predetermined voltage, the power converter apparatus comprising:

a switching circuit;

a reactor that receives an input voltage and outputs the input voltage to a series circuit of the first and second semiconductor devices; and an electrolytic capacitor that smooths a voltage switched by the first and second semiconductor devices, wherein the switching circuit comprising a voltage balance circuit, the switching circuit switching an input voltage, and outputting a switched input voltage, the switching circuit comprising first and second semiconductor devices that respectively serve as switching elements, wherein the first and second control signals respectively serving as first and second switching control signals, wherein the voltage balance circuit keeps balance among respective output voltages from a plurality of semiconductor devices connected in series with each other, the plurality of semiconductor devices including at least first and second semiconductor devices, each of the first and second semiconductor devices including a control electrode and first and second device electrodes, wherein the voltage balance circuit comprises:

a first transformer consisting of a primary winding and a secondary winding;

a second transformer consisting of a primary winding and a secondary winding; and first and second capacitors connected in series with each other, wherein one end of the first capacitor is connected with the first device electrode of the first semiconductor device, wherein one end of the second capacitor is connected with the second device electrode of the second semiconductor device, wherein another ends of the first and second capacitors are connected with each other, and are connected with another end of the secondary winding of the first transformer, wherein a first output terminal of a first control signal for controlling the first semiconductor device is connected with one end of the primary winding of the first transformer, and another end of the primary winding of the first transformer is connected with the control electrode of the first semiconductor device, wherein a second output terminal of the first control signal is connected with the second device electrode of the first semiconductor device, the first device electrode of the second semiconductor device, and another end of the second winding of the second transformer, wherein a first output terminal of a second control signal for controlling the second semiconductor device is connected with the one end of the primary winding of the second transformer, and another end of the primary winding of the second transformer is connected with the control electrode of the second semiconductor device, wherein a second output terminal of the second control signal is connected with the second device electrode of the second semiconductor device, wherein the first control signal is applied to the control electrode of the first semiconductor device through the primary winding of the first transformer, wherein the second control signal is applied to the control electrode of the second semiconductor device through the primary winding of the second transformer, and wherein one ends of the secondary windings are connected with each other.

* * * * *